United States Patent
Ji (10) Patent No.: US 12,372,586 B2
(45) Date of Patent: Jul. 29, 2025

(54) DELTA VOLTAGE HYBRID BATTERY FUEL GAUGE

(71) Applicant: Medtronic, Inc., Minneapolis, MN (US)

(72) Inventor: Gang Ji, Medina, MN (US)

(73) Assignee: Medtronic, Inc., Minneapolis, MN (US)

( * ) Notice: Subject to any disclaimer, the term of this patent is extended or adjusted under 35 U.S.C. 154(b) by 449 days.

(21) Appl. No.: 17/933,912

(22) Filed: Sep. 21, 2022

(65) Prior Publication Data

US 2024/0094305 A1   Mar. 21, 2024

(51) Int. Cl.
| | | |
|---|---|---|
| *G01R 31/396* | (2019.01) | |
| *G01R 31/367* | (2019.01) | |
| *G01R 31/3842* | (2019.01) | |
| *H01M 10/42* | (2006.01) | |
| *H01M 10/48* | (2006.01) | |
| *H02J 7/00* | (2006.01) | |

(52) U.S. Cl.
CPC ......... *G01R 31/396* (2019.01); *G01R 31/367* (2019.01); *G01R 31/3842* (2019.01); *H01M 10/425* (2013.01); *H01M 10/486* (2013.01); *H02J 7/0048* (2020.01); *H01M 2010/4271* (2013.01); *H01M 2220/30* (2013.01)

(58) Field of Classification Search
CPC ............... G01R 31/396; G01R 31/367; G01R 31/3842; G01R 31/3648; G01R 31/3833; H01M 10/425; H01M 10/486; H01M 2010/4271; H01M 2220/30; H02J 7/0048
See application file for complete search history.

(56) References Cited

U.S. PATENT DOCUMENTS

| | | | |
|---|---|---|---|
| 7,095,211 B2 | 8/2006 | Denning | |
| 8,643,331 B1 * | 2/2014 | Wortham | H01M 10/48 320/132 |
| 9,423,465 B1 | 8/2016 | Watts | |

(Continued)

FOREIGN PATENT DOCUMENTS

JP    2012008556 A * 1/2012 ............ H02J 7/0031

OTHER PUBLICATIONS

International Search Report and Written Opinion of International Application No. PCT/IB2023/058930 dated Dec. 6, 2023, 11 pp.

(Continued)

*Primary Examiner* — Daniel R Miller
(74) *Attorney, Agent, or Firm* — Shumaker & Sieffert, P.A.

(57) ABSTRACT

Example devices and techniques are described herein for determining a relative state-of-charge of a battery. An example device includes memory, a battery, a temperature sensor and processing circuitry coupled to the memory and the temperature sensor. The temperature sensor may be configured to sense a battery temperature. The processing circuitry may be configured to estimate an end-of-discharge state-of-charge of the battery. The processing circuitry may be configured to estimate a remaining capacity of the battery. The processing circuitry may be configured to estimate a full charge capacity of the battery. The processing circuitry may be configured to estimate a relative state-of-charge of the battery and generate a representation of the estimate of the relative state-of-charge of the battery for output.

20 Claims, 6 Drawing Sheets

(56) References Cited

U.S. PATENT DOCUMENTS

| | | |
|---|---|---|
| 10,132,867 B1 | 11/2018 | Kondo |
| 10,408,887 B2 | 9/2019 | Shimizu |
| 10,705,147 B2 | 7/2020 | Shimizu |
| 10,802,078 B2 | 10/2020 | Tamegai et al. |
| 10,928,457 B2 | 5/2021 | Wampler, II |
| 11,035,902 B2 | 6/2021 | Huang |
| 11,280,839 B2 | 3/2022 | Kondo |
| 2013/0193912 A1 | 8/2013 | Bornhoft |
| 2014/0177145 A1 | 6/2014 | Kawahara et al. |
| 2014/0236511 A1 | 8/2014 | Kulkarni et al. |
| 2021/0270906 A1 | 9/2021 | Chou et al. |

OTHER PUBLICATIONS

Dung et al., "A Voltage-Gradient Based Gas Gauge Platform for Lithium-ion Batteries," Proceedings of the IEEE International Conference on Applied System Innovation 2018, Apr. 13, 2018, pp. 789-792.

Movassagh et al., "A Critical Look at Coulomb Counting Approach for State of Charge Estimation in Batteries," MDPI, Energies, vol. 14, No. 4074, doi.org/10.3390/en14144074, Jul. 6, 2021, 33 pp.

Power Sonic, "BU-903: How to Measure State-of-charge," Battery University, accessed from https://batteryuniversity.com/article/bu-903-how-to-measure-state-of-charge, Dec. 31, 2021, 5 pp.

Zheng et al., "Influence of different open circuit voltage tests on state of charge online estimation for lithium-ion batteries," Elsevier, Science Direct, Applied Energy, vol. 183, Sep. 10, 2016, pp. 513-525.

\* cited by examiner

DELTA VOLTAGE HYBRID BATTERY FUEL GAUGE

TECHNICAL FIELD

The disclosure relates to rechargeable batteries and, more particularly, to a device having a fuel gauge for determining a relative state-of-charge of a rechargeable battery.

BACKGROUND

Many devices, including implantable medical devices, laptop computers, tablets, and cellular phones, among others, utilize rechargeable batteries. These devices also typically include a battery management system, which may include a fuel gauge, that may provide a user of the device with a representation of the state-of-charge of the battery, such as how fully charged the battery may be.

SUMMARY

In some aspects, the disclosure is directed to devices that utilize rechargeable batteries, such as implantable medical devices, laptop computers, tablets or cellular phones, for example, and techniques for such devices to determine a relative state-of-charge for the batteries.

In one example, the disclosure is directed to a device including a memory; a battery; a temperature sensor, the temperature sensor being configured to sense a battery temperature; and processing circuitry coupled to the memory and the temperature sensor, the processing circuitry being configured to: estimate an end-of-discharge state-of-charge of the battery based at least in part on a scaled voltage difference between an estimated present open circuit voltage and a cutoff voltage; estimate a remaining capacity of the battery based at least in part on a difference between an estimated present state-of-charge, an estimated end-of-discharge state-of-charge, and a maximum battery capacity at the battery temperature; estimate a full charge capacity of the battery based at least in part on a difference between an end-of-charge state-of-charge and the estimated end-of-discharge state-of-charge, and the maximum battery capacity at the battery temperature; estimate a relative state-of-charge of the battery based at least in part on the estimated full charge capacity of the battery and the estimated remaining capacity of the battery; and generate a representation of the estimated relative state-of-charge of the battery for output.

In another example, the disclosure is directed to a method including estimating an end-of-discharge state-of-charge of a battery based at least in part on a scaled voltage difference between an estimated present open circuit voltage and a cutoff voltage; estimating a remaining capacity of the battery based at least in part on a difference between an estimated present state-of-charge, an estimated end-of-discharge state-of-charge, and a maximum battery capacity at a battery temperature; estimating the full charge capacity of the battery based at least in part on a difference between an end-of-charge state-of-charge and the estimated end-of-discharge state-of-charge, and the maximum battery capacity at the battery temperature; estimating the relative state-of-charge of the battery based at least in part on the estimated full charge capacity of the battery and the estimated remaining capacity of the battery; and generating a representation of the estimate of the relative state-of-charge of the battery for output.

In another example, the disclosure is directed to a non-transitory storage medium comprising instructions that when executed by one or more processors cause the one or more processors to: estimate an end-of-discharge state-of-charge of a battery based at least in part on a scaled voltage difference between an estimated present open circuit voltage and a cutoff voltage; estimate a remaining capacity of the battery based at least in part on a difference between an estimated present state-of-charge, an estimated end-of-discharge state-of-charge, and a maximum battery capacity at a battery temperature; estimate a full charge capacity of the battery based at least in part on a difference between an end-of-charge state-of-charge and the estimated end-of-discharge state-of-charge, and the maximum battery capacity at the battery temperature; estimate a relative state-of-charge of the battery based at least in part on the estimated full charge capacity of the battery and the estimated remaining capacity of the battery; and generate a representation of the estimate of the relative state-of-charge of the battery for output.

The details of one or more examples of the disclosure are set forth in the accompanying drawings and the description below. Other features, objects, and advantages of the disclosure will be apparent from the description and drawings, and from the claims.

DETAILED DESCRIPTION

A variety of devices may utilize rechargeable batteries as a power source for operational power. For example, an implantable medical device (IMD) that provides cardiac rhythm management therapy to a patient, monitors one or more physiological parameters of the patient, or provides neurostimulation therapy to the patient may include a rechargeable battery to supply power for the generation of electrical therapy or other functions of the IMD. As another example, a left-ventricular assist device (LVAD) may include a rechargeable battery to supply power for a pump and other functions of the LVAD. Rechargeable batteries typically have a fuel gauge that monitors the battery and provides information regarding the state of the battery to a device, such as an IMD, a laptop computer, a tablet, a cellular phone, or other device. Such information may include a relative state-of-charge, for example, such as 80% charged.

The accurate fuel gauging of a rechargeable battery may be critical for the safe and effective operation of many medical applications. For example, one may want to recharge a medical device if the state-of-charge is too low to power therapy circuitry prior to attempting to provide such therapy. The simplest technique to determine the state-of-charge is based on the battery voltage, but may have a large swing in the state-of-charge estimation when a dynamic load is applied due to voltage drop caused by the internal and external impedance of the battery. Coulomb counting is another technique for battery fuel gauging, which provides stable state-of-charge estimation under dynamic loads. However, when the battery is under large pulse loads, such as those that might be caused by a medical device delivering pulsed electrical stimulation, the Coulomb counter-based fuel gauge may fail to accurately predict the battery voltage, may hit a cutoff threshold prematurely due to battery impedance, and/or may overestimate the state-of-charge. Coulomb counting may also suffer from accumulative error as the offset of a differential amplifier accumulates.

In some medical devices, such as IMDs configured to deliver electrical stimulation therapy, a large current draw by stimulation generation circuitry during an attempt to deliver of electrical stimulation, may cause the IMD to not deliver electrical stimulation even if there is some amount of remaining charge on the battery powering the IMD. As such, it may be desirable to represent the relative state-of-charge of the battery to be empty (e.g., zero) prior to the battery actually reaching zero charge. In this manner, a user may be prompted to recharge the IMD prior to the IMD not being able to deliver the electrical stimulation, thereby improving the ability of the IMD to deliver efficacious therapy.

A delta voltage hybrid battery fuel gauge (e.g., for a medical device) is described herein. Such a fuel gauge may be a hybrid fuel gauge employing both voltage-based techniques and Coulomb counting techniques to minimize drawbacks of each individual technique and to improve overall fuel gauge performance and/or accuracy.

Figure 1:
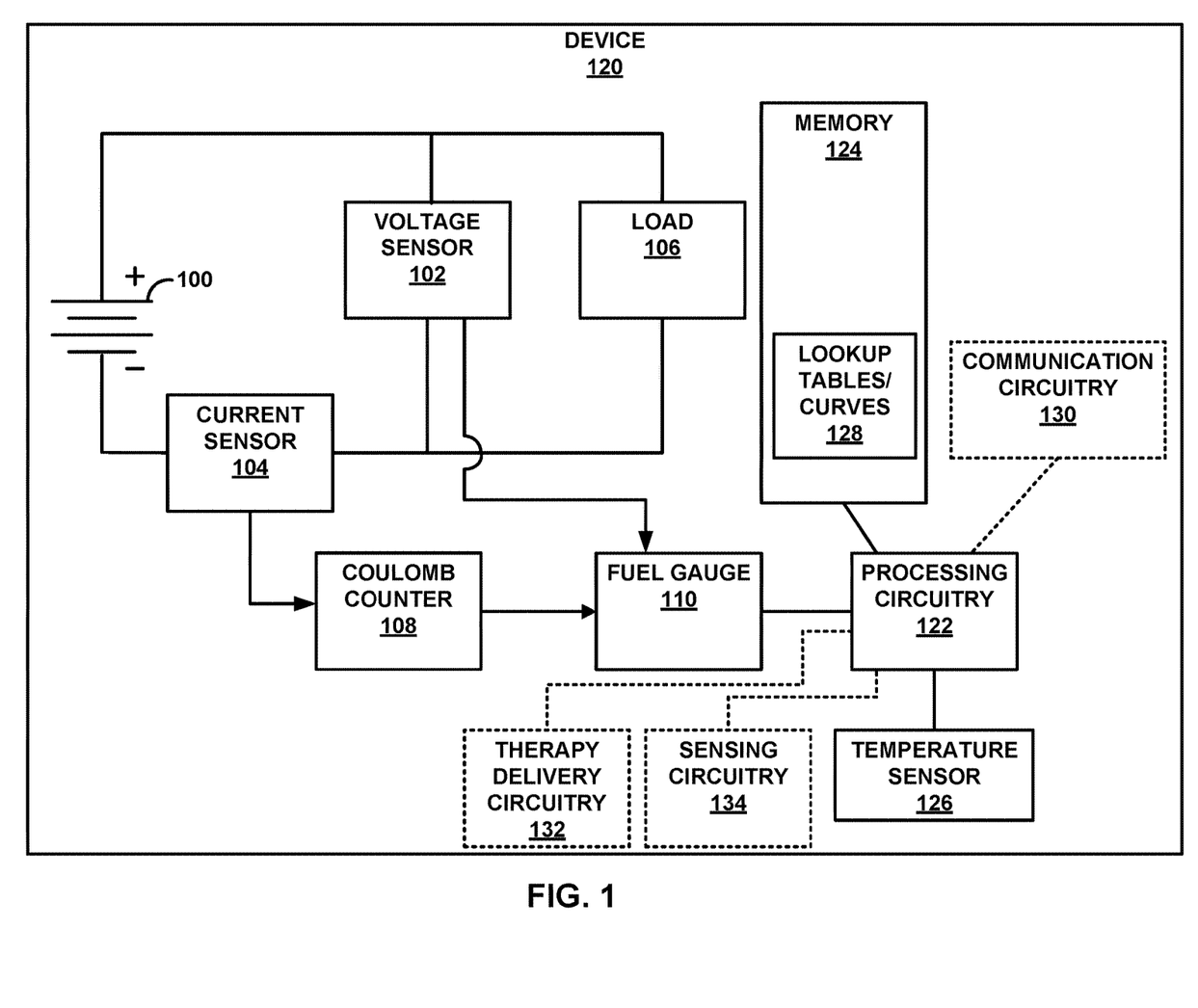
FIG. 1 is a block diagram of an example device according to one or more aspects of this disclosure.

FIG. 1 is a block diagram of a device including a delta voltage hybrid battery fuel gauge according to the techniques of this disclosure. FIG. 1 depicts a device 120, which may be an IMD, an external medical device, a laptop computer, a tablet, a cellular phone or any other device that utilizes a rechargeable battery to power its operations. Device 120 includes battery 100, voltage sensor 102, current sensor 104, load 106, coulomb counter 108, fuel gauge 110 (which may be a delta voltage hybrid fuel gauge), processing circuitry 122, temperature sensor 126, and memory 124. In some examples, such as where device 120 represents an IMD or a cellular phone, device 120 may include communication circuitry 130. Communication circuitry 130 is represented in dashed lines as communication circuitry 130 may not be present in all examples of device 120.

In some examples, such as where device 120 represents an IMD, device 120 may include therapy delivery circuitry 132 and/or sensing circuitry 134. Therapy delivery circuitry 132 may be configured to deliver therapy to tissue of a patient. Sensing circuitry 134 may be configured to sense physiological parameters of the patient. In some examples, sensing circuitry 134 and therapy delivery circuitry 132 may be configured to operate cooperatively. For example, physiological parameters sensed by sensing circuitry 134 may be used to affect therapy that is delivered by therapy delivery circuitry 132.

Battery 100 may be a rechargeable battery that provides power to device 120. Voltage sensor 102 may measure the voltage across load 106 and output the measured voltage to fuel gauge 110. Current sensor 104 may measure a current flowing through device 120 and output the measured current to coulomb counter 108. Coulomb counter 108 may be configured to track the measured current over time and determine a total sum of energy entering or leaving battery 100. Coulomb counter 108 may output the total sum of energy entering or leaving battery 100 to fuel gauge 110.

Processing circuitry 122 may include one or more general purpose microprocessors, digital signal processors (DSPs), application specific integrated circuits (ASICs), field programmable logic arrays (FPGAs), or other equivalent integrated or discrete logic circuitry. Processing circuitry 122 may be configured to execute computer-readable instructions, which may be stored in memory 124, to provide various functionality to device 120. While shown separate from fuel gauge 110, in some examples, fuel gauge 110 may be part of processing circuitry 122.

Memory 124 may store such instructions as mentioned above. Memory 124 may also store lookup tables/curves 128. Lookup tables/curves 128 may include the lookup tables and curves described herein which may be used by fuel gauge 110 to determine a relative state-of-charge of battery 100.

Temperature sensor 126 may be configured to sense or measure an operating temperature of battery 100, of a battery pack (not shown), of device 120, or the like. Batteries, like battery 100, may be sensitive to temperature, so more accurate determination of a relative state-of-charge of battery 100 may take temperature into account. As such, lookup tables/curves 128 may include different entries, different tables, and/or different curves for different battery temperatures.

While load 106 is shown separately, load 106 may include other components of device 120, such as processing circuitry 122, etc. It should be noted that device 120 may include other components such as stimulation generation circuitry, battery recharge circuitry, a user interface which may display the relative state-of-charge, or the like.

Figure 2:
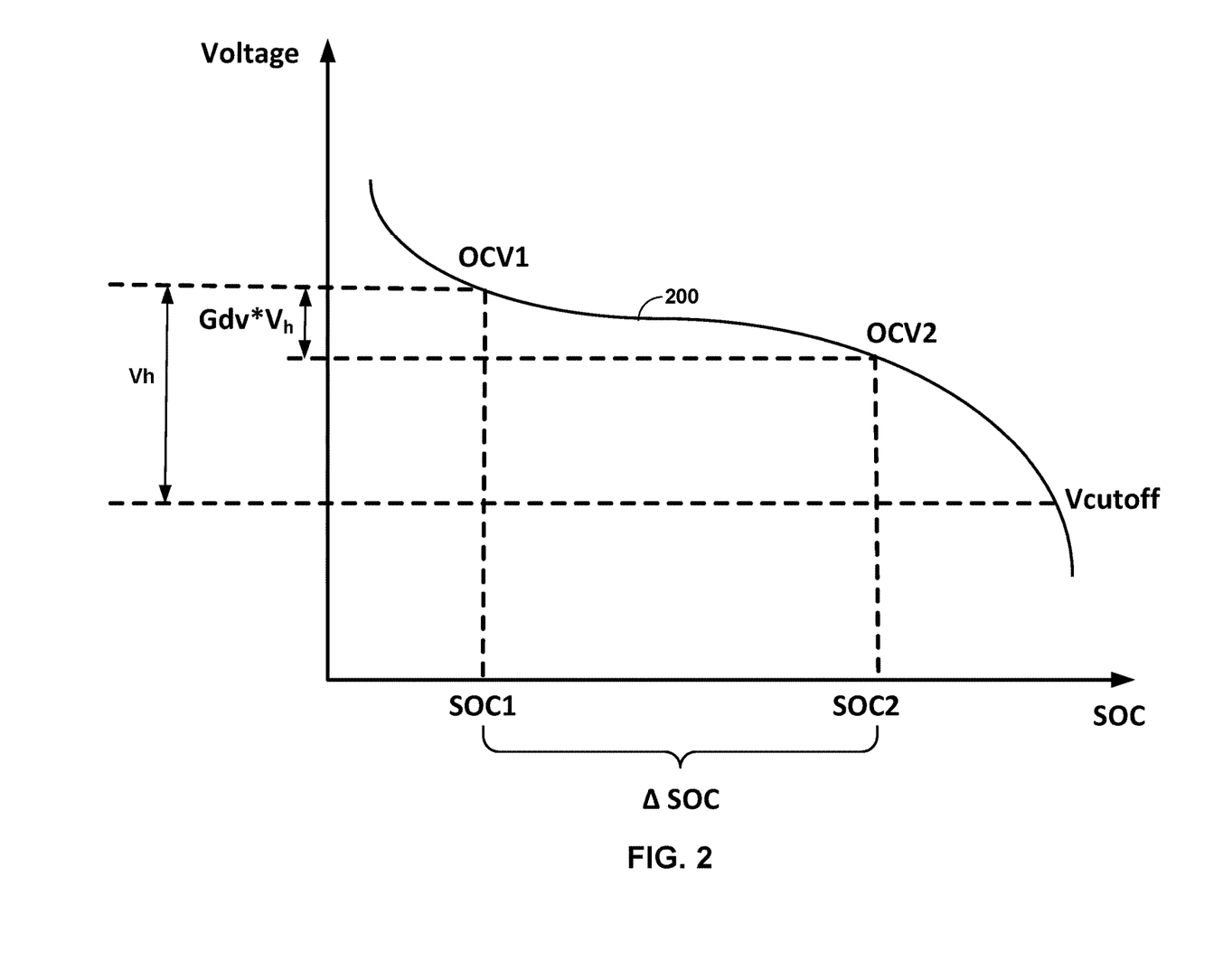
FIG. 2 is a conceptual diagram of an example open circuit voltage-to-state-of-charge (OCV-to-SOC) curve according to one or more aspects of this disclosure.

FIG. 2 is a conceptual diagram of an example open circuit voltage-to-state-of-charge (OCV-to-SOC) curve according to one or more aspects of this disclosure. OCV-to-SOC curve 200 may represent a plot of battery voltages for different state-of-charges for battery 100 at a given temperature. A plurality of different such OCV-to-SOC curves may be stored in lookup tables/curves 128 with each curve being associated with a different battery temperature. Such an OCV-to-SOC curve 200 curve may be referenced by fuel gauge 110 when estimating a relative state-of-charge of battery 100 as discussed hereinafter.

FIG. 2 also depicts various additional concepts. For example, a present state-of-charge, SOC1, which is associated with a present open circuit voltage, OCV1 is depicted. Additionally, an end-of-discharge state-of-charge, SOC2, which is associated with an end-of-discharge open circuit voltage, OCV2 is also depicted. A voltage difference (also called a headroom voltage), $V_h$, between the present open circuit voltage, OCV1, and a cutoff voltage, $V_{cutoff}$, is also depicted. The cutoff voltage may determined by the battery manufacturer and stored in the memory 124. If the battery voltage drops to the cutoff voltage, the discharge may be terminated. Additionally, a scaled $V_h$, ($Gdv*V_h$), is depicted. A difference, $\Delta$ SOC, between the present state-of-charge, SOC1, and the end-of-discharge state-of-charge, SOC2, is also depicted. These concepts are referred to hereinafter and a reader of this disclosure may reference back to FIG. 2 when these concepts are further discussed.

Figure 3:
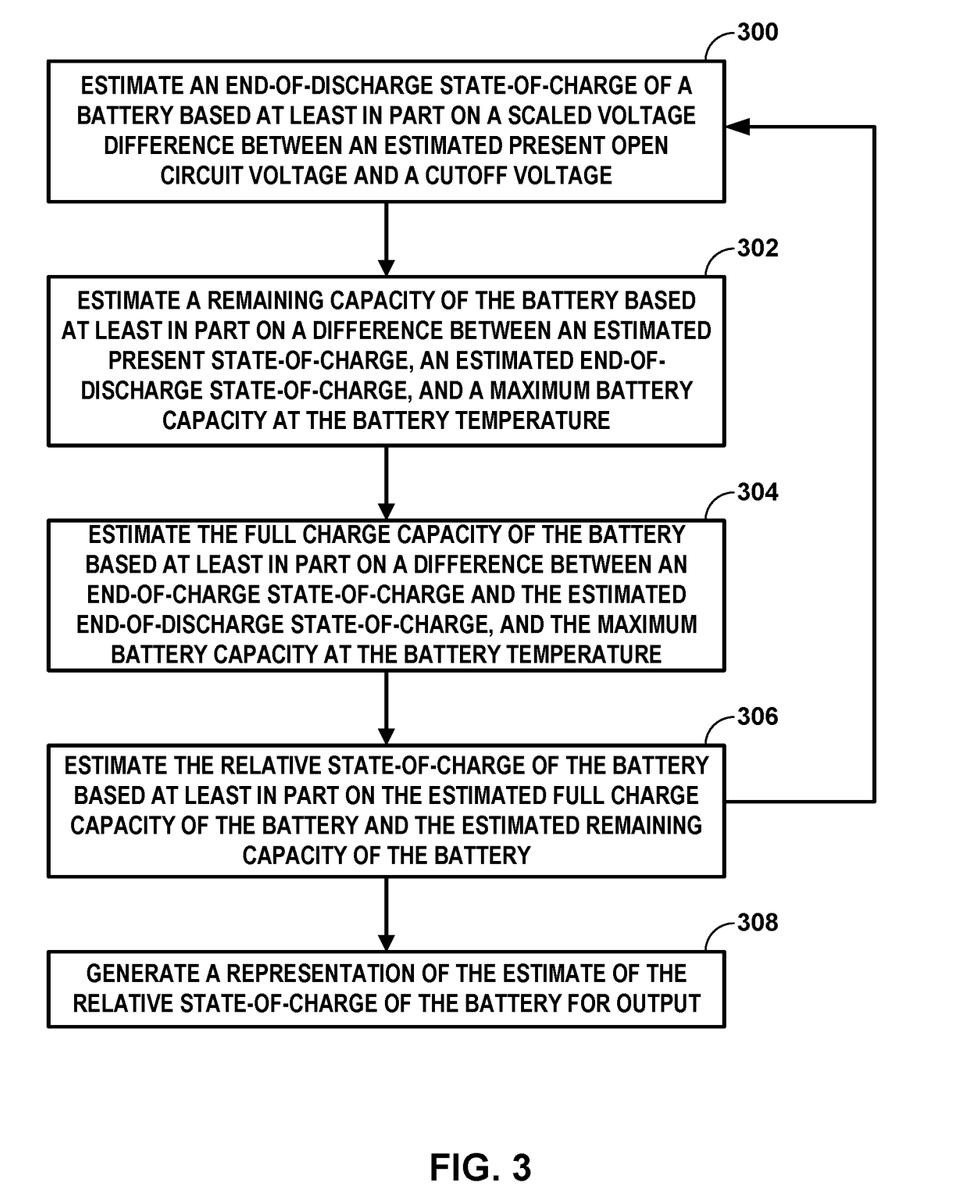
FIG. 3 is a flow diagram illustrating example delta voltage hybrid fuel gauge techniques according to one or more aspects of this disclosure.

FIG. 3 is a flow diagram illustrating example delta hybrid fuel gauge techniques according to one or more aspects of this disclosure. Fuel gauge 110 may estimate an end-of-discharge state-of-charge of battery 100 based at least in part on a scaled voltage difference between an estimated present open circuit voltage and a cutoff voltage (300). For example, fuel gauge 110 may estimate a present state-of-charge, SOC1, based on Coulomb counter 108 output and a maximum battery capacity, CapMax, at the battery temperature as sensed by temperature sensor 126. Fuel gauge 110 may estimate a present open circuit voltage, OCV1, at the estimated present state-of-charge, SOC1. Fuel gauge 110 may determine a voltage difference, $V_h$, between the estimated present open circuit voltage, OCV1, and a cutoff voltage, $V_{cutoff}$. Fuel gauge 110 may scale the determined voltage difference with a delta voltage coefficient, Gdv. Such scaling may be desirable to avoid situations where device 120 may be unable to perform desired functions because current draw is relatively high and battery 100 voltage may drop to the cutoff voltage under the operating current. Fuel gauge 110 may estimate an end-of-discharge open circuit voltage, OCV2, based at least in part on the scaled determined voltage difference, $(Gdv*V_h)$. Fuel gauge 110 may estimate an end-of-discharge state-of-charge, SOC2, based at least in part on the estimated end-of-discharge open circuit voltage, OCV2.

Fuel gauge 110 may estimate a remaining capacity of battery 100 based at least in part on a difference between an estimated present state-of-charge, an estimated end-of-discharge state-of-charge, and a maximum battery capacity at the battery temperature (302). For example, fuel gauge 110 may determine a difference between the present state-of-charge and the end-of-discharge state-of-charge, ΔSOC. Fuel gauge 110 may determine a maximum battery capacity, CapMax, based on the battery temperature. For example, fuel gauge 110 may look up the maximum battery capacity, CapMax, at a temperature sensed by temperature sensor 126 in lookup tables/curves 128. Fuel gauge 110 may estimate a remaining capacity, $Capacity_{remaining}$, of battery 100 based at least in part on the difference between the present state-of-charge, SOC1, the end-of-discharge state-of-charge, SOC2, and the maximum battery capacity, CapMax, at the given temperature.

Fuel gauge 110 may estimate a full charge capacity based at least in part on a difference between an end-of-charge state-of-charge and the estimated end-of-discharge state-of-charge, and the maximum battery capacity at the battery temperature (304). For example, fuel gauge 110 may determine a difference between the end-of-charge state-of-charge, SOCtop (e.g., the state-of-charge after fully charging battery 100) and the end-of-discharge state-of-charge, SOC2. The end-of-charge state-of-charge, SOCtop, may be defined by a manufacturer of battery 100 and be stored in lookup tables/curves 128. Fuel gauge 110 may determine the end-of-charge state-of-charge, SOCtop, by looking the end-of-charge state-of-charge up in lookup tables/curves 128. For example, fuel gauge 110 may determine the difference, $ΔSOC_{full}$, between the end-of-charge state-of-charge, SOCtop, and the end-of-discharge state-of-charge, SOC2, by subtracting the end-of-discharge state-of-charge from the end-of-charge state-of-charge ($ΔSOC_{full}$=SOCtop−SOC2). Fuel gauge 110 may determine the full charge capacity, $Capacity_{full}$, of battery 100 by multiplying the difference, $ΔSOC_{full}$, between the end-of-charge state-of-charge, SOCtop, and the end-of-discharge state-of-charge, SOC2, by the maximum battery capacity at the battery temperature ($Capacity_{full}=ΔSOC_{full}*CapMax$).

Fuel gauge 110 may estimate a relative state-of-charge based at least in part on the estimated full charge capacity of battery 100 and the estimated remaining capacity of battery 100 (306). For example, fuel gauge 110 may divide the remaining capacity of battery 100 by the full charge capacity of battery 100 to determine the relative state-of-charge (relative state-of-charge, RSOC=$Capacity_{remaining}$/$Capacity_{full}$). Fuel gauge 110 may generate a representation of the estimate of the relative state-of-charge of battery 100 for output (308). For example, fuel gauge 110 may generate a representation for display in a user interface of device 120 or of a different device (e.g., when device 120 is an implantable medical device). In this manner. a user of device 120 may be better informed regarding the relative state-of-charge of battery 100.

Figure 4:
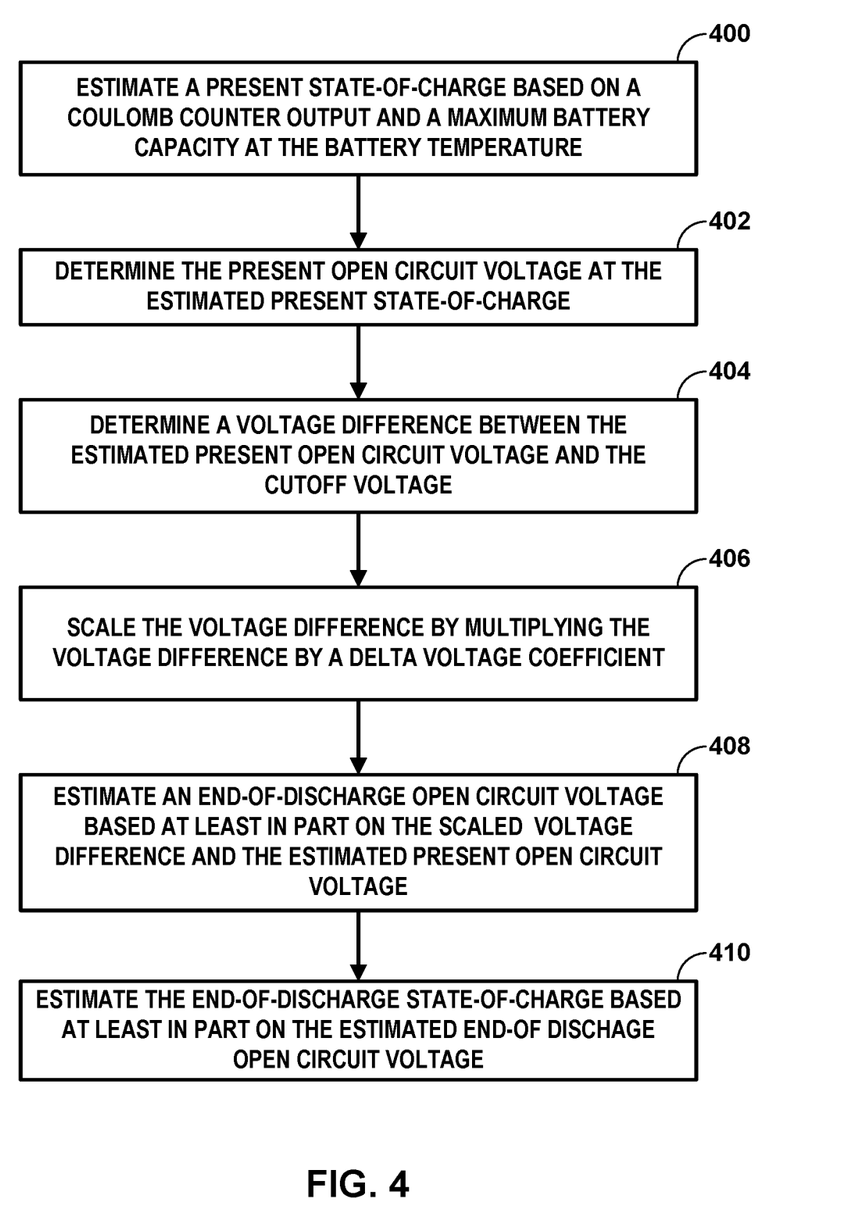
FIG. 4 is a flow diagram illustrating example techniques for estimating an end-of-discharge state-of-charge according to one or more aspects of this disclosure.

FIG. 4 is a flow diagram illustrating example techniques for estimating an end-of-discharge state-of-charge according to one or more aspects of this disclosure. FIG. 4 shows example techniques to estimate the state-of-charge when the battery discharge may be terminated. Fuel gauge 110 may estimate a present state-of-charge, SOC1 (FIG. 2), based on a Coulomb counter 108 output and the maximum battery capacity at a given temperature (400). For example, the Coulomb counter output may include the charge entering or leaving battery 100 by integrating measured current over time. Fuel gauge 110 may determine the given temperature based on output of temperature sensor 126. For example, the given temperature may be a battery temperature sensed by temperature sensor 126. Fuel gauge 110 or processing circuitry 122 may look up the maximum battery capacity at the sensed battery temperature in a lookup table of lookup tables/curves 128 of memory. Fuel gauge 110 may then subtract (or add) the indicated charge leaving (or entering) battery 100 as output by Coulomb counter 108 from the maximum battery capacity at the sensed battery temperature to estimate the present state-of-charge, SOC1.

Fuel gauge 110 may determine a present open circuit voltage, OCV1 (FIG. 2), at the estimated present state-of-charge, SOC1 (402). For example, fuel gauge 110 may look up the estimated present state-of-charge, SOC1, in an SOC-to-OCV lookup table or curve (such as the example of FIG. 2), from lookup tables/curves 128, for the sensed battery temperature to determine the present open circuit voltage, OCV1. Fuel gauge 110 may determine a voltage difference, $V_h$ (FIG. 2), between the estimated present open circuit voltage, OCV1, and the cutoff voltage, $V_{cutoff}$ (FIG. 2) (404). In some examples, this voltage difference may be referred to as a voltage headroom. For example, to account for the impact of a battery 100 voltage drop under load 106, fuel gauge 110 may determine a voltage headroom, $V_h$, as:

$$V_h=OCV1-V_{cutoff}$$

where $V_{cutoff}$ is the discharge cutoff voltage. To determine $V_{cutoff}$, fuel gauge 110 may look up the cutoff voltage for battery 100 in a memory 124.

Fuel gauge 110 may scale the voltage difference by multiplying the voltage difference by a delta voltage coefficient, Gdv (406). For example, to compensate for the steep voltage curve close to the end of discharge, fuel gauge 110 may compensate or scale the determined voltage difference (voltage headroom, $V_h$) by a delta voltage coefficient Gdv, for example by multiplying Gdv and $V_h$, $(Gdv*V_h)$. Fuel gauge 110 may then calculate an end-of-discharge open circuit voltage, OCV2 (408). For example, fuel gauge 110 may calculate the end-of-discharge open circuit voltage, OCV2 (FIG. 2), as:

$$OCV2=OCV1-Gdv*V_h.$$

In some examples, fuel gauge 110 may update the delta voltage coefficient Gdv as needed for a change in the battery voltage response due to variations in state-of-charge, temperature, load current, battery aging, or the like. For example, fuel gauge 110 may determine whether a present battery voltage is lower than the present open circuit voltage, OCV1. If the present battery voltage is lower than the present open circuit voltage, OCV1, fuel gauge 110 may determine Gdv as:

$$Gdv = \frac{V_h}{(OCV1 - V_{cell})}$$

$$Gdv_{min} < Gdv < Gdv_{max}$$

where Gdv is the delta voltage coefficient, $V_h$ is the voltage difference, OCV1 is the present open circuit voltage, $V_{cell}$ is the present battery voltage, $Gdv_{min}$ is a minimum delta voltage coefficient, and $Gdv_{max}$ is a maximum delta voltage coefficient. For example, fuel gauge 110 may determine that the present battery voltage is lower than the present open circuit voltage, OCV1, and based on the present battery voltage being lower than the present open circuit voltage, determine Gdv as described above. If the present battery voltage is not lower than the present open circuit voltage, OCV1, fuel gauge 110 may leave Gdv unchanged (e.g., use a previously calculated Gdv).

Fuel gauge 110 may estimate an end-of-discharge state-of-charge, SOC2, based at least in part on the estimated end-of-discharge open circuit voltage, OCV2 (310). For example, fuel gauge 110 may determine the end-of-discharge state-of-charge, SOC2 (FIG. 2), by looking up OCV2 in the OCV-to-SOC table of lookup tables/curves 128 at the given temperature. It should be noted that the end-of-discharge state-of-charge, SOC2, may be greater than 0% as a large current draw by device 120 may effectively shut down device 120 before battery 100 reaches a 0% state-of-charge.

Figure 5:
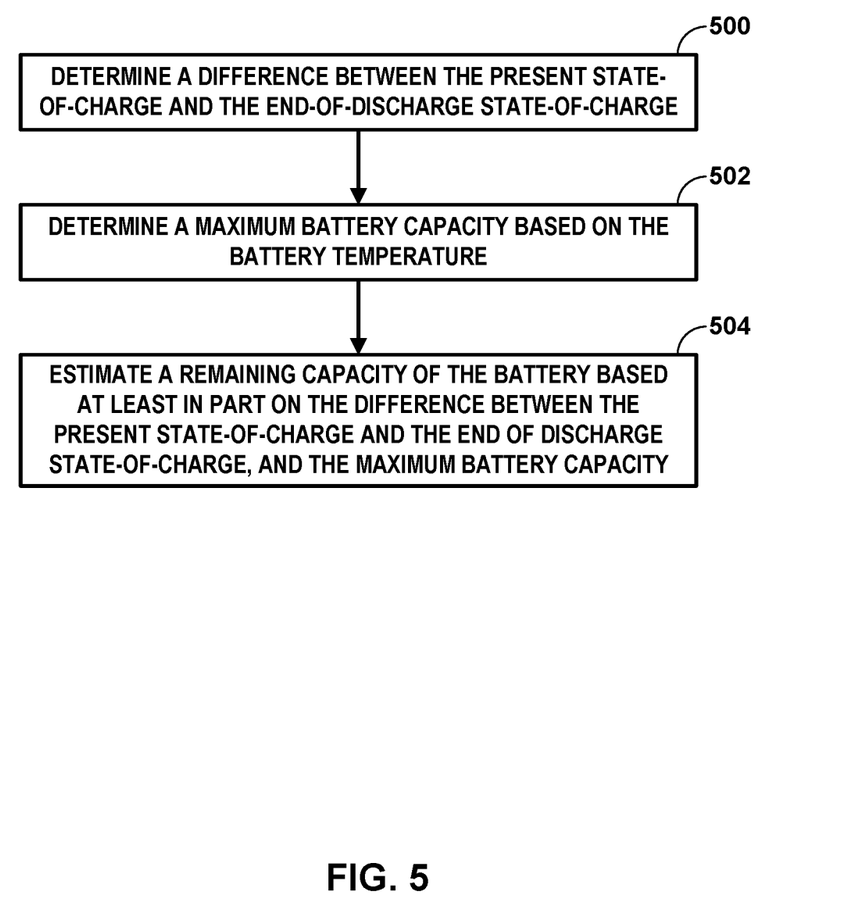
FIG. 5 is a flow diagram illustrating example techniques for estimating a remaining battery capacity according to one or more aspects of this disclosure.

FIG. 5 is a flow diagram illustrating example techniques for estimating a remaining battery capacity according to one or more aspects of this disclosure. Fuel gauge 110 may calculate a difference, ΔSOC (FIG. 2), between the present state-of-charge, SOC1, and the end-of-discharge state-of-charge, SOC2 (500). For example, fuel gauge 110 may calculate the difference between the present state-of-charge and the end-of-discharge state-of-charge, ΔSOC, by subtracting SOC2 from SOC1 (SOC1−SOC2). Fuel gauge 110 may determine a maximum battery capacity based on the battery temperature (502). For example, fuel gauge 110 may determine the maximum battery capacity, CapMax, at the given temperature by looking up the maximum battery capacity at the given temperature in a lookup table or curve of lookup tables/curves 128. Fuel gauge 110 may estimate a remaining capacity of battery 100 based at least in part on the difference, ΔSOC, between the present state-of-charge and the end-of-discharge state-of-charge, and the maximum battery capacity, CapMax (504). For example, fuel gauge 110 may estimate the remaining capacity, Capacity$_{remaining}$, of battery 100 by multiplying the difference, ΔSOC, between the present state-of-charge, SOC1, and the end-of-discharge state-of-charge, SOC2, by the maximum battery capacity (Capacity$_{remaining}$=ΔSOC*CapMax).

Figure 6:
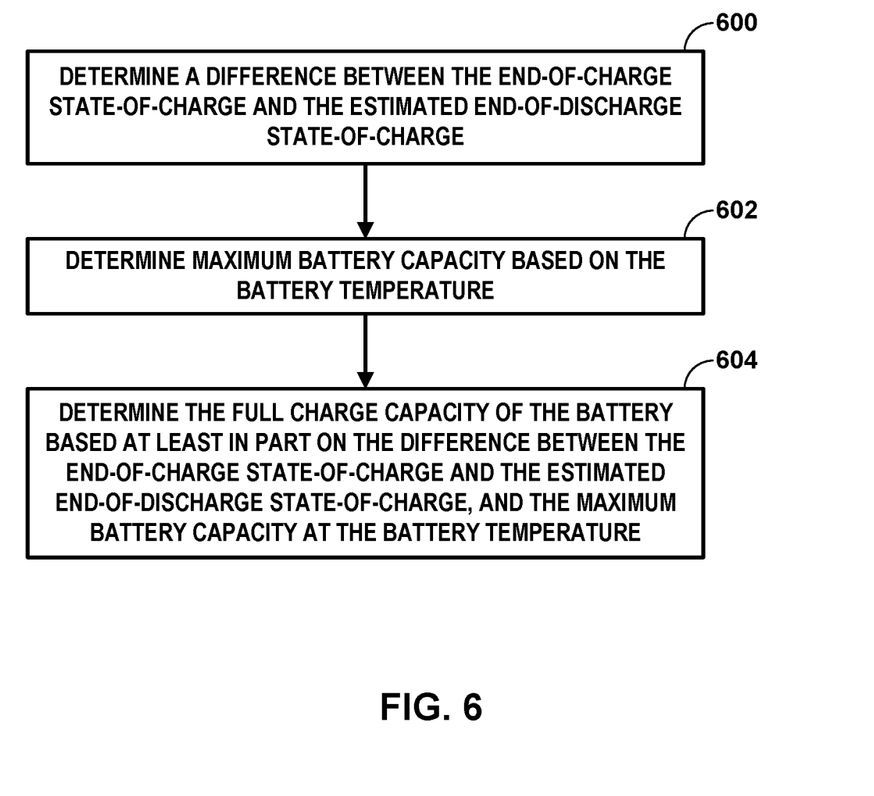
FIG. 6 is a flow diagram illustrating example techniques for calculating a full charge capacity according to one or more aspects of this disclosure.

FIG. 6 is a flow diagram illustrating example techniques for calculating a full charge capacity according to one or more aspects of this disclosure. Fuel gauge 110 may determine a difference between the end-of-charge state-of-charge, SOCtop (e.g., the state-of-charge after fully charging battery 100) and the end-of-discharge state-of-charge, SOC2 (600). For example, fuel gauge 110 may determine the difference, ΔSOC$_{full}$, between the end-of-charge state-of-charge, SOCtop, and the end-of-discharge state-of-charge, SOC2, by subtracting the end-of-discharge state-of-charge from the end-of-charge state-of-charge (ΔSOC$_{full}$=SOCtop−SOC2). The end-of-charge state-of-charge, SOCtop, may be defined by a manufacturer of battery 100 and stored in lookup tables/curves 128. In some examples, the end-of-charge state-of-charge may be 100%. In other examples, the end-of-charge state-of-charge may be less than 100%.

Fuel gauge 110 may determine a maximum battery capacity based on the battery temperature (602). For example, fuel gauge 110 may determine the maximum battery capacity, CapMax, at the given temperature by looking up the maximum battery capacity at the given temperature in a lookup table of lookup tables/curves 128. In the example where the techniques of FIG. 6 are used together with the techniques of FIG. 5, the same value for the maximum battery capacity may be used for both FIG. 5 and FIG. 6. In this manner, a double lookup of the maximum battery capacity may be avoided, thereby saving processing power. Fuel gauge 110 may determine the full charge capacity of battery 100 (604). For example, fuel gauge 110 may determine the full charge capacity of battery 100 by multiplying the difference between the end-of-charge state-of-charge and the end-of-discharge state-of-charge by the maximum battery capacity at the battery temperature (Capacity$_{full}$=ΔSOC$_{full}$*CapMax).

As, described above, to estimate the relative state-of-charge (RSOC), fuel gauge 110 may divide the estimated remaining capacity by the full charge capacity (RSOC=Capacity$_{remaining}$/Capacity$_{full}$). Fuel gauge 110 may generate an indication of the relative state-of-charge for output, such as for display in a user interface.

In some examples, the techniques of this disclosure may be continuously performed as the load changes to continuously monitor the battery state-of-charge and remaining capacity. In some examples, the techniques of this disclosure may be performed periodically. In some examples, the techniques of this disclosure may be performed in response to user input, such as a request to display a relative state-of-charge.

Device 120 may include electronics and other internal components necessary or desirable for executing the functions associated with the device. In one example, device 120 includes one or more of processing circuitry 122, memory 124, therapy delivery circuitry 132, sensing circuitry 134, communication circuitry 130, temperature sensor 126, and a power source (e.g., battery 100). In general, memory 124 of device 120 may include computer-readable instructions that, when executed by processing circuitry 122 of device 120, cause it to perform various functions attributed to the device herein.

Device 120 may include or may be one or more processors or processing circuitry, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor" and "processing circuitry" as used herein may refer to any of the foregoing structure or any other structure suitable for implementation of the techniques described herein.

Memory 124 may include any volatile or non-volatile media, such as a random-access memory (RAM), read only memory (ROM), non-volatile RAM (NVRAM), electrically erasable programmable ROM (EEPROM), flash memory, and the like. Memory 124 may be a storage device or other non-transitory medium.

This disclosure includes the following non-limiting examples.

Example 1. A device comprising: a memory; a battery; a temperature sensor, the temperature sensor being configured to sense a battery temperature; and processing circuitry coupled to the memory and the temperature sensor, the processing circuitry being configured to: estimate an end-of-discharge state-of-charge of the battery based at least in part on a scaled voltage difference between an estimated present open circuit voltage and a cutoff voltage; estimate a remaining capacity of the battery based at least in part on a difference between an estimated present state-of-charge, an estimated end-of-discharge state-of-charge, and a maximum battery capacity at the battery temperature; estimate a full charge capacity of the battery based at least in part on a difference between an end-of-charge state-of-charge and the estimated end-of-discharge state-of-charge; estimate a relative state-of-charge of the battery based at least in part on the estimated full charge capacity of the battery and the estimated remaining capacity of the battery, and the maximum battery capacity at the battery temperature; and generate a representation of the estimated relative state-of-charge of the battery for output.

Example 2. The device of example 1, wherein as part of estimating the end-of-discharge state-of-charge of the battery, the processing circuitry is configured to: estimate a present state-of-charge based on a Coulomb counter output and a maximum battery capacity at the battery temperature; determine the present open circuit voltage at the estimated present state-of-charge; determine a voltage difference between the estimated present open circuit voltage and the cutoff voltage; scale the voltage difference by multiplying the voltage difference by a delta voltage coefficient; estimate an end-of-discharge open circuit voltage based at least in part on the scaled voltage difference and the estimated present open circuit voltage; and estimate the end-of-discharge state-of-charge based at least in part on the estimated end-of-discharge open circuit voltage.

Example 3. The device of example 2, wherein the processing circuitry is further configured to: determine that a present battery voltage is lower than the present open circuit voltage; and based on the present battery voltage being lower than the present open circuit voltage, determine the delta voltage coefficient as: $Gdv = V_h / ((OCV1 - V_{cell}))$, $Gdv_{min} < Gdv < Gdv_{max}$, where Gdv is the delta voltage coefficient, $V_h$ is the voltage difference, OCV1 is the present open circuit voltage, $V_{cell}$ is the present battery voltage, $Gdv_{min}$ is a minimum delta voltage coefficient, and $Gdv_{mx}$ is a maximum delta voltage coefficient.

Example 4. The device of example 2 or example 3, wherein as part of estimating the end-of-discharge open circuit voltage, the processing circuitry is configured to subtract the scaled voltage difference from the estimated present open circuit voltage.

Example 5. The device of any of examples 1-4, wherein as part of estimating the remaining capacity of the battery, the processing circuitry is configured to: determine a difference between an estimated present state-of-charge and the estimated end-of-discharge state-of-charge; determine a maximum battery capacity based on the battery temperature; and estimate a remaining capacity of the battery based at least in part on the difference between the estimated present state-of-charge and the estimated end-of-discharge state-of-charge and the maximum battery capacity.

Example 6. The device of example 5, wherein as part of estimating the remaining capacity of the battery, the processing circuitry is configured to multiply the difference between the estimated present state-of-charge and the estimated end-of-discharge state-of-charge by the maximum battery capacity.

Example 7. The device of any of examples 1-6, wherein as part of estimating the full charge capacity of the battery, the processing circuitry is configured to: determine a difference between an end-of-charge state-of-charge and the estimated end-of-discharge state-of-charge; determine a maximum battery capacity based on the battery temperature; and determine the full charge capacity of the battery based at least in part on the difference between the end-of-charge state-of-charge and the estimated end-of-discharge state-of-charge, and the maximum battery capacity.

Example 8. The device of example 7, wherein as part of determining the full charge capacity of the battery, the processing circuitry is configured to multiply the difference between the end-of-charge state-of-charge and the estimated end-of-discharge state-of-charge by the maximum battery capacity.

Example 9. The device of any of examples 1-8, wherein as part of estimating the relative state-of-charge of the battery, the processing circuitry is configured to divide the estimated remaining capacity of the battery by the estimated full charge capacity of the battery.

Example 10. The device of any of examples 1-9, further comprising communication circuitry, wherein the processing circuitry is further configured to control the communication circuitry to transmit the representation of the estimate of the relative state-of-charge to another device.

Example 11. The device of any of examples 1-10, wherein the device comprises an implantable medical device.

Example 12. A method comprising: estimating an end-of-discharge state-of-charge of a battery based at least in part on a scaled voltage difference between an estimated present open circuit voltage and a cutoff voltage; estimating a remaining capacity of the battery based at least in part on a difference between an estimated present state-of-charge, an estimated end-of-discharge state-of-charge, and a maximum battery capacity at a battery temperature; estimating a full charge capacity of the battery based at least in part on a difference between an end-of-charge state-of-charge and the estimated end-of-discharge state-of-charge and the maximum battery capacity at the battery temperature; estimating a relative state-of-charge of the battery based at least in part on the estimated full charge capacity of the battery and the estimated remaining capacity of the battery; and generating a representation of the estimate of the relative state-of-charge of the battery for output.

Example 13. The method of example 12, wherein estimating the end-of-discharge state-of-charge of the battery comprises: estimating a present state-of-charge based on a Coulomb counter output and a maximum battery capacity at the battery temperature; determine the present open circuit voltage at the estimated present state-of-charge; determining a voltage difference between the estimated present open circuit voltage and the cutoff voltage; scaling the determined voltage difference by multiplying the voltage difference by a delta voltage coefficient; estimating an end-of-discharge open circuit voltage based at least in part on the scaled determined voltage difference and the estimated present open circuit voltage; and estimating the end-of-discharge state-of-charge based at least in part on the estimated end-of-discharge open circuit voltage.

Example 14. The method of example 13, further comprising: determining that a present battery voltage is lower than the present open circuit voltage; and based on the present battery voltage being lower than the present open circuit voltage, determining the delta voltage coefficient as: $Gdv=V_h/((OCV1-V_{cell}))$, $Gdv_{min}<Gdv<Gdv_{max}$, where Gdv is the delta voltage coefficient, $V_h$ is the voltage difference, OCV1 is the present open circuit voltage, $V_{cell}$ is the present battery voltage, $Gdv_{min}$ is a minimum delta voltage coefficient, and $Gdv_{max}$ is a maximum delta voltage coefficient.

Example 15. The method of example 13 or example 14, wherein estimating the end-of-discharge open circuit voltage comprises subtracting the scaled determined voltage difference from the estimated present open circuit voltage.

Example 16. The method of any of examples 12-15, wherein estimating the remaining capacity of the battery comprises: determining a difference between an estimated present state-of-charge and the estimated end-of-discharge state-of-charge; determining a maximum battery capacity based on the battery temperature; and estimating a remaining capacity of the battery based at least in part on the difference between the estimated present state-of-charge and the estimated end-of-discharge state-of-charge and the maximum battery capacity.

Example 17. The method of any of examples 12-16, wherein estimating the full charge capacity of the battery comprises: determining a difference between an end-of-charge state-of-charge and the end-of-discharge state-of-charge; determining a maximum battery capacity based on the battery temperature; and determining the full charge capacity of the battery based at least in part on the difference between the end-of-charge state-of-charge and the estimated end-of-discharge state-of-charge, and the maximum battery capacity.

Example 18. The method of any of examples 12-17, wherein estimating the relative state-of-charge of the battery comprises dividing the estimated remaining capacity of the battery by the estimated full charge capacity of the battery.

Example 19. The method of any of examples 12-18, further comprising transmitting the representation of the estimated relative state-of-charge to another device.

Example 20. A non-transitory storage medium comprising instructions that when executed by one or more processors cause the one or more processors to: estimate an end-of-discharge state-of-charge of a battery based at least in part on a scaled voltage difference between an estimated present open circuit voltage and a cutoff voltage; estimate a remaining capacity of the battery based at least in part on a difference between an estimated present state-of-charge, an estimated end-of-discharge state-of-charge, and a maximum battery capacity at a battery temperature; estimate a full charge capacity of the battery based at least in part on a difference between an end-of-charge state-of-charge and the estimated end-of-discharge state-of-charge, and the maximum battery capacity at the battery temperature; estimate a relative state-of-charge of the battery based at least in part on the estimated full charge capacity of the battery and the estimated remaining capacity of the battery; and generate a representation of the estimate of the relative state-of-charge of the battery for output.

Various examples have been described in the disclosure. These and other examples are within the scope of the following claims.

The invention claimed is:

1. A device comprising:
a memory;
a battery;
a temperature sensor, the temperature sensor being configured to sense a battery temperature of the battery; and
processing circuitry coupled to the memory and the temperature sensor, the processing circuitry being configured to:
estimate an end-of-discharge state-of-charge of the battery based at least in part on a scaled voltage difference between an estimated present open circuit voltage and a cutoff voltage, and an estimated end-of-discharge open circuit voltage;
estimate a remaining capacity of the battery based at least in part on a difference between an estimated present state-of-charge and an estimated end-of-discharge state-of-charge, and a maximum battery capacity at the battery temperature;
estimate a full charge capacity of the battery based at least in part on a difference between an end-of-charge state-of-charge and the estimated end-of-discharge state-of-charge, and the maximum battery capacity at the battery temperature;
estimate a relative state-of-charge of the battery based at least in part on the estimated full charge capacity of the battery and the estimated remaining capacity of the battery; and
generate a representation of the estimated relative state-of-charge of the battery for output.

2. The device of claim 1, wherein as part of estimating the end-of-discharge state-of-charge of the battery, the processing circuitry is configured to:
estimate a present state-of-charge based on a Coulomb counter output and a maximum battery capacity at the battery temperature;
estimate the present open circuit voltage at the estimated present state-of-charge;
determine a voltage difference between the estimated present open circuit voltage and the cutoff voltage;
scale the voltage difference by multiplying the voltage difference by a delta voltage coefficient;
estimate the end-of-discharge open circuit voltage based at least in part on the scaled voltage difference and the estimated present open circuit voltage; and
estimate the end-of-discharge state-of-charge based at least in part on the estimated end-of-discharge open circuit voltage.

3. The device of claim 2, wherein the processing circuitry is further configured to:
determine that a present battery voltage is lower than the present open circuit voltage; and
based on the present battery voltage being lower than the present open circuit voltage, determine the delta voltage coefficient as:

$$Gdv = \frac{V_h}{(OCV1 - V_{cell})}$$

$$Gdv_{min} < Gdv < Gdv_{max}$$

where Gdv is the delta voltage coefficient, $V_h$ is the voltage difference, OCV1 is the present open circuit voltage, $V_{cell}$ is the present battery voltage, $Gdv_{min}$ is a minimum delta voltage coefficient, and $Gdv_{max}$ is a maximum delta voltage coefficient.

4. The device of claim 2, wherein as part of estimating the end-of-discharge open circuit voltage, the processing circuitry is configured to subtract the scaled voltage difference from the estimated present open circuit voltage.

5. The device of claim 1, wherein as part of estimating the remaining capacity of the battery, the processing circuitry is configured to:
  determine a difference between an estimated present state-of-charge and the estimated end-of-discharge state-of-charge;
  determine a maximum battery capacity based on the battery temperature; and
  estimate a remaining capacity of the battery based at least in part on the difference between the estimated present state-of-charge and the estimated end-of-discharge state-of-charge and the maximum battery capacity.

6. The device of claim 5, wherein as part of estimating the remaining capacity of the battery, the processing circuitry is configured to multiply the difference between the estimated present state-of-charge and the estimated end-of-discharge state-of-charge by the maximum battery capacity.

7. The device of claim 1, wherein as part of estimating the full charge capacity of the battery, the processing circuitry is configured to:
  determine a difference between an end-of-charge state-of-charge and the estimated end-of-discharge state-of-charge;
  determine a maximum battery capacity based on the battery temperature; and
  determine the full charge capacity of the battery based at least in part on the difference between the end-of-charge state-of-charge and the estimated end-of-discharge state-of-charge, and the maximum battery capacity.

8. The device of claim 7, wherein as part of determining the full charge capacity of the battery, the processing circuitry is configured to multiply the difference between the end-of-charge state-of-charge and the estimated end-of-discharge state-of-charge by the maximum battery capacity.

9. The device of claim 1, wherein as part of estimating the relative state-of-charge of the battery, the processing circuitry is configured to divide the estimated remaining capacity of the battery by the estimated full charge capacity of the battery.

10. The device of claim 1, further comprising communication circuitry, wherein the processing circuitry is further configured to control the communication circuitry to transmit the representation of the estimate of the relative state-of-charge to another device.

11. The device of claim 1, wherein the device comprises an implantable medical device.

12. A method comprising:
  sensing, by a temperature sensor, a battery temperature of a battery;
  estimating, by processing circuitry, an end-of-discharge state-of-charge of the battery based at least in part on a scaled voltage difference between an estimated present open circuit voltage and a cutoff voltage, and an estimated end-of-discharge open circuit voltage;
  estimating, by the processing circuitry, a remaining capacity of the battery based at least in part on a difference between an estimated present state-of-charge and an estimated end-of-discharge state-of-charge, and a maximum battery capacity at the battery temperature;
  estimating, by the processing circuitry, a full charge capacity of the battery based at least in part on a difference between an end-of-charge state-of-charge and the estimated end-of-discharge state-of-charge, and the maximum battery capacity at the battery temperature;
  estimating, by the processing circuitry, a relative state-of-charge of the battery based at least in part on the estimated full charge capacity of the battery and the estimated remaining capacity of the battery; and
  generating, by the processing circuitry, a representation of the estimate of the relative state-of-charge of the battery for output.

13. The method of claim 12, wherein estimating the end-of-discharge state-of-charge of the battery comprises:
  estimating a present state-of-charge based on a Coulomb counter output and a maximum battery capacity at the battery temperature;
  estimating the present open circuit voltage at the estimated present state-of-charge;
  determining a voltage difference between the estimated present open circuit voltage and the cutoff voltage;
  scaling the determined voltage difference by multiplying the voltage difference by a delta voltage coefficient;
  estimating the end-of-discharge open circuit voltage based at least in part on the scaled determined voltage difference and the estimated present open circuit voltage; and
  estimating the end-of-discharge state-of-charge based at least in part on the estimated end-of-discharge open circuit voltage.

14. The method of claim 13, further comprising:
  determining, by the processing circuitry, that a present battery voltage is lower than the present open circuit voltage; and
  based on the present battery voltage being lower than the present open circuit voltage, determining, by the processing circuitry, the delta voltage coefficient as:

$$Gdv = \frac{V_h}{(OCV1 - V_{cell})}$$

$$Gdv_{min} < Gdv < Gdv_{max}$$

where Gdv is the delta voltage coefficient, $V_h$ is the voltage difference, OCV1 is the present open circuit voltage, $V_{cell}$ is the present battery voltage, $Gdv_{min}$ is a minimum delta voltage coefficient, and $GdV_{max}$ is a maximum delta voltage coefficient.

15. The method of claim 13, wherein estimating the end-of-discharge open circuit voltage comprises subtracting the scaled determined voltage difference from the estimated present open circuit voltage.

16. The method of claim 12, wherein estimating the remaining capacity of the battery comprises:
  determining a difference between an estimated present state-of-charge and the estimated end-of-discharge state-of-charge;
  determining a maximum battery capacity based on the battery temperature; and
  estimating a remaining capacity of the battery based at least in part on the difference between the estimated present state-of-charge and the estimated end-of-discharge state-of-charge and the maximum battery capacity.

17. The method of claim 12, wherein estimating the full charge capacity of the battery comprises:
  determining a difference between an end-of-charge state-of-charge and the end-of-discharge state-of-charge;
  determining a maximum battery capacity based on the battery temperature; and determining the full charge capacity of the battery based at least in part on the difference between the end-of-charge state-of-charge and the estimated end-of-discharge state-of-charge, and the maximum battery capacity.

18. The method of claim 12, wherein estimating the relative state-of-charge of the battery comprises dividing the estimated remaining capacity of the battery by the estimated full charge capacity of the battery.

19. The method of claim 12, further comprising transmitting, via communication circuitry, the representation of the estimated relative state-of-charge to another device.

20. A non-transitory storage medium comprising instructions that, when executed by one or more processors of a device comprising a battery and a temperature sensor configured to sense a battery temperature of the battery, cause the one or more processors to:

estimate an end-of-discharge state-of-charge of the battery based at least in part on a scaled voltage difference between an estimated present open circuit voltage and a cutoff voltage, and an estimated end-of-discharge open circuit voltage;

estimate a remaining capacity of the battery based at least in part on a difference between an estimated present state-of-charge, an estimated end-of-discharge state-of-charge, and a maximum battery capacity at the battery temperature;

estimate a full charge capacity of the battery based at least in part on a difference between an end-of-charge state-of-charge and the estimated end-of-discharge state-of-charge, and the maximum battery capacity at a battery temperature;

estimate a relative state-of-charge of the battery based at least in part on the estimated full charge capacity of the battery and the estimated remaining capacity of the battery; and generate a representation of the estimate of the relative state-of-charge of the battery for output.

* * * * *